United States Patent [19]

Hobrock

[11] Patent Number: 5,463,494
[45] Date of Patent: Oct. 31, 1995

[54] EXTRINSIC SEMICONDUCTOR OPTICAL FILTER

[75] Inventor: Lowell M. Hobrock, Los Angeles, Calif.

[73] Assignee: Hughes Aircraft Company, Los Angeles, Calif.

[21] Appl. No.: 174,573

[22] Filed: Dec. 23, 1993

Related U.S. Application Data

[63] Continuation of Ser. No. 912,404, Jul. 13, 1992, abandoned.

[51] Int. Cl.$^6$ .............................. G02B 5/20; G02B 5/28; H01L 31/00
[52] U.S. Cl. ...................... 359/359; 257/451; 359/589; 359/590
[58] Field of Search ........................... 357/30 L; 359/359, 359/589, 590, 248, 887; 257/431, 432, 436, 451

[56] References Cited

U.S. PATENT DOCUMENTS

| | | | |
|---|---|---|---|
| 3,885,855 | 5/1975 | Gross | 359/590 |
| 4,497,974 | 2/1985 | Deckman et al. | 357/30 L |
| 4,528,418 | 7/1985 | McGill | 357/30 L |
| 4,581,280 | 4/1986 | Taguchi et al. | |

FOREIGN PATENT DOCUMENTS

| | | | |
|---|---|---|---|
| 0214045 | 3/1987 | European Pat. Off. | |
| 2637616 | 2/1978 | Germany | 359/590 |
| 60-171775 | 9/1985 | Japan . | |
| 62-49335 | 3/1987 | Japan | 359/590 |
| 2-177379 | 7/1990 | Japan . | |

OTHER PUBLICATIONS

Kottler et al, "Mixed–Semiconductor Evaporated Films as Filters with Very Sharp Cutoff and Some Possible Applications in Electrooptics," *Applied Optics*, vol. 17, No. 2, 15 Jan. 1978, pp. 164–165.

Furman et al., "Brief Communications—Long–wavelength Cutoff Filters, Isolating the 14–25 µm Region", Soviet Journal of Optical Technology, vol. 42, No. 12, Dec. 1975, New York, USA.

Seeley, et al., "Far Infrared Filters for the Galileo–Jupiter and Other Missions", 2219 Applied Optics, vol. 20 (1981) Jan., No. 1, New York, USA.

*Primary Examiner*—Martin Lerner
*Attorney, Agent, or Firm*—H. P. Gortler; M. W. Sales; W. K. Denson-Low

[57] ABSTRACT

An optical filter (18) includes a first layer (22) of material having a bandgap and being doped with an impurity having an energy level in the bandgap such that the first layer absorbs optical energy below a first wavelength and transmits optical energy thereabove. The filter further includes a second layer of optical material (26) disposed on said first layer (22) which transmits optical energy at a second wavelength, above the first wavelength, and reflects optical energy at a third wavelength above the second wavelength. The first and second layers in combination provide a filter (18) with high transmission in-band, low transmission out-of-band and a sharp cutoff therebetween.

18 Claims, 3 Drawing Sheets

FIG. 5(a)
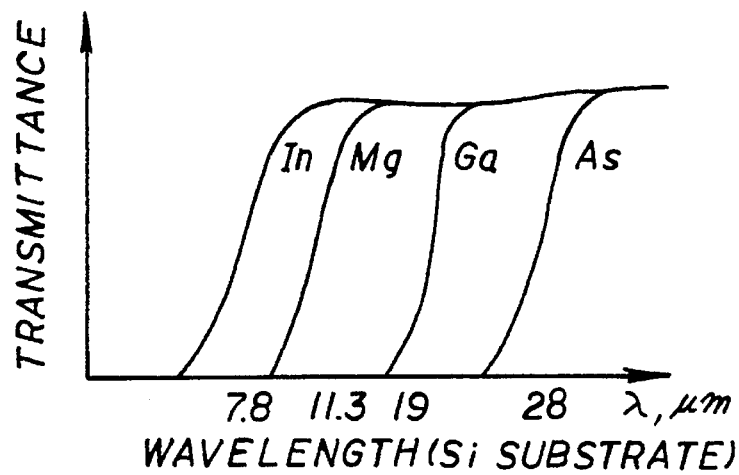
FIG. 5(b)
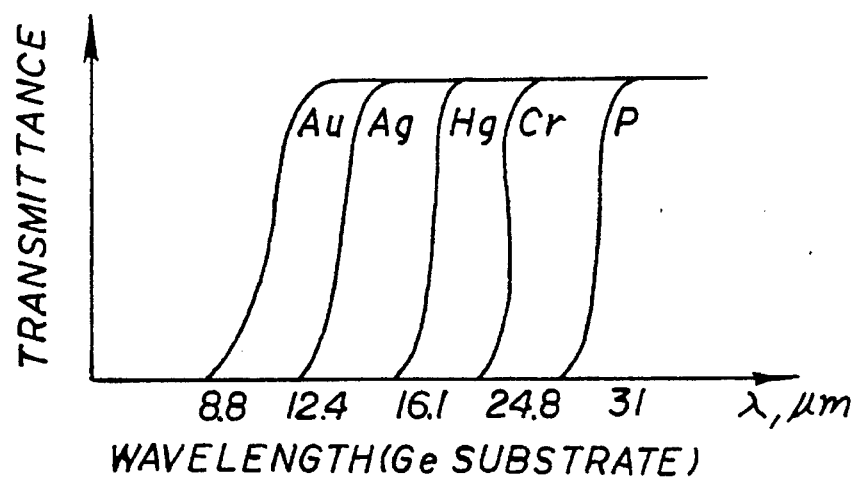
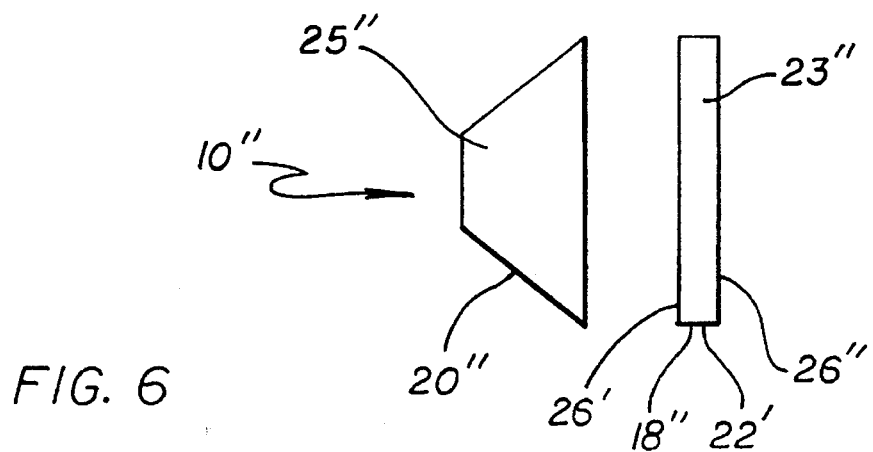
FIG. 6

EXTRINSIC SEMICONDUCTOR OPTICAL FILTER

This is a continuation of application Ser. No. 07/912,404, filed Jul. 13, 1992 now abandoned.

BACKGROUND OF THE INVENTION

1. Field of the Invention

The present invention relates to optical filters. More specifically the invention relates to semiconductor optical filters having a substrate and a multi-layer optical thin film deposited thereon.

While the present invention is described herein with reference to illustrative embodiments for particular applications, it should be understood that the invention is not limited thereto. Those having ordinary skill in the art and access to the teachings provided herein will recognize additional modifications, applications, and embodiments within the scope thereof and additional fields in which the present invention would be of significant utility.

2. Description of the Related Art

Optical detectors are used in optical space sensors and other applications. In many cases, the detector is an infrared sensor combined with an optical filter. The optical filter defines the spectral band of radiation that will be sensed by the detector. One such optical filter is known as a long wavelength infrared (LWIR) multilayer dielectric (MLD) interference filter.

LWIR MLD filters are constructed by coating a semiconductor or dielectric substrate with alternating layers of high refractive index and low refractive index optical thin film materials. By depositing high and low refractive index materials of the proper optical thickness, these interference filters can be made to reflect certain out-of-band wavelengths while transmitting in-band wavelengths. Thus by altering the thickness of each layer of the filter, a controlled amount of radiation in a narrow band of frequencies will be allowed to enter the detector.

The typical design goals of conventional long wavelength infrared (LWIR) filters are to achieve: 1) broadband rejection, i.e., the filter should have a low out-of-band transmission; 2) high in-band transmission, allowing the selected transmission bands to enter the detector with minimum attenuation; and 3) a sharp cut-off slope, that is, the transition between transmitting and nontransmitting wavelength regions should be clearly defined.

The need for broadband rejection requires an MLD filter of conventional construction with many layers. It is not uncommon for as many as 300 layers to be used in the construction of a single MLD filter. Each layer is one-quarter of the operating wavelength divided by the index of refraction. Thus with an operating wavelength of 20 microns and an index of refraction of say 2, each layer must be at least 2.5 microns thick. Three hundred such layers would be 750 microns thick. At this thickness, the interference filter may be thicker than the dielectric or semiconductor substrate. Thus, the filter must often be split between two or three substrates. This creates a packaging problem.

Also the many layers of coating limits the speed (f-number) of the optical system. This is due to the fact that the spectral width of the transmitting region of these thick interference filters is shifted for incoming radiation at large angles of incidence (i.e. low f-number). Thus in low f-number systems the transition between the transmitting and nontransmitting regions would occur at the wrong wavelength. This limitation results in a larger optical system (i.e. high f-number) which is undesirable.

These optical filters are designed to function in cryogenic environments and therefore must be durable as well as functional. In accordance with conventional design techniques, it is difficult to fabricate the filter for such environments due to stress and adhesion problems associated therewith. Hence, at present, only a few optical filter manufacturers have the capability of making these filters. Accordingly, the filters tend to be quite expensive.

Thus, there is a need in the art for a compact, durable, and cost effective filter which affords greater control of in-band and out-of-band transmission and is insensitive to the system f-number.

SUMMARY OF THE INVENTION

The need in the art is addressed by the optical filter of the present invention which, in a most general sense, includes a first layer of material having a bandgap and being doped with an impurity having an energy level in the bandgap such that the first layer absorbs optical energy below a first wavelength and transmits optical energy thereabove. A second layer of optical material is disposed on the first layer which transmits optical energy at a second wavelength, above the first wavelength, and reflects optical energy at a third wavelength above the second wavelength. The first and second layers in combination provide a filter with high transmission in-band, low transmission out-of-band and a sharp cutoff therebetween.

The filter is constructed by a) depositing a layer of semiconductive material having a bandgap onto a substrate; b) doping the layer of semiconductive material with a dopant having an energy level in the bandgap; and c) depositing an interference filter on the layer of semiconductive material. In a more specific embodiment, the doping step further includes the steps of: b1) calculating a desired attenuation given an out-of-band transmission desired for the filter; b2) selecting a type of the dopant based on the cutoff parameter of out-of-band transmission desired for the filter; b3) given the desired thickness of the layer of semiconductive material, calculating the absorption coefficient required for the filter; b4) determining the concentration of the chosen dopant based on the calculated absorption coefficient; and b5) doping the layer of desired thickness of semiconductive material with the dopant in accordance with the ascertained concentration. Finally, the transmission characteristic of the interference filter is specified based on the transmission characteristic of the layer of semiconductive material.

The present invention allows for the achievement of out-of-band rejection two to three orders of magnitude greater than current state of the art long wave infrared (LWIR) optical filters. Thus, the teachings provided by the present invention allows for filter with substantially fewer coating layers for a given level of performance as most of the out-of-band rejection is achieved by absorption in the extrinsic semiconductor substrate.

BRIEF DESCRIPTION OF THE DRAWINGS

FIG. 2($b$) is a graph representing the transmission characteristic of the conventional LWIR MLD filter.

FIG. 5(a) illustrates the transmission characteristics as a function of wavelength, $\delta$ in microns, of a filter constructed in accordance with the present teachings having a silicon substrate and various dopants shown.

FIG. 5(b) illustrates the transmission characteristics as a function of wavelength, $\delta$ in microns, of a filter constructed in accordance with the present teachings having a germanium substrate and various dopants shown.

FIG. 6 is an alternative embodiment of the present invention in which the multiple layers of optical thin film material are replaced by doping of the detector in accordance with the present teachings to provide an optical arrangement with a precisely defined passband.

DESCRIPTION OF THE INVENTION

Illustrative embodiments and exemplary applications will now be described with reference to the accompanying drawings to disclose the advantageous teachings of the present invention.

Figure 1:
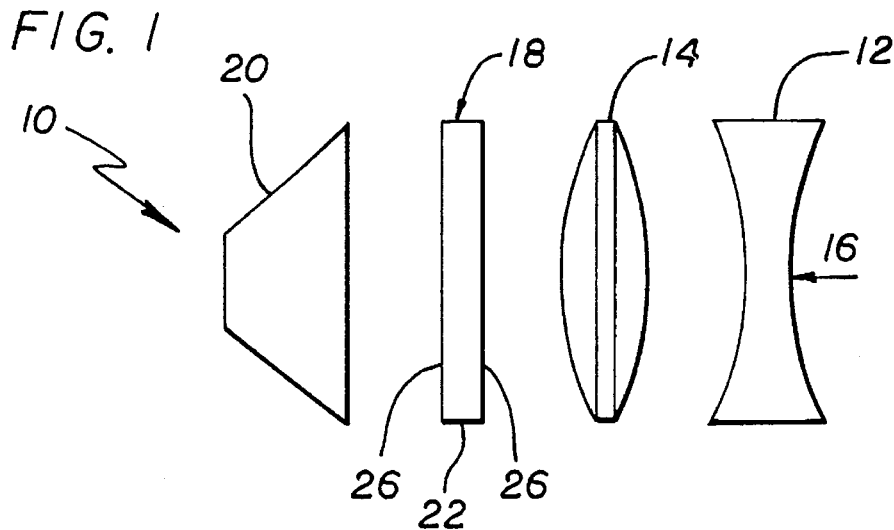
FIG. 1 is an operational block diagram of a typical optical sensing system.

FIG. 1 is an operational block diagram of a typical optical sensing system 10. The system 10 is comprised of front end optics 12, 14 which focus and direct incoming radiation 16 onto an optical filter 18. The filter 18 includes one or more substrates 22 each coated with multiple layers of optical thin film material 26 providing an interference filter therefor. The filter 18 defines a narrow band of wavelengths which enter an optical detector 20. The detector 20 includes sensors (not shown) adapted to absorb the wavelengths of interest and provide a corresponding output.

Figure 2A:
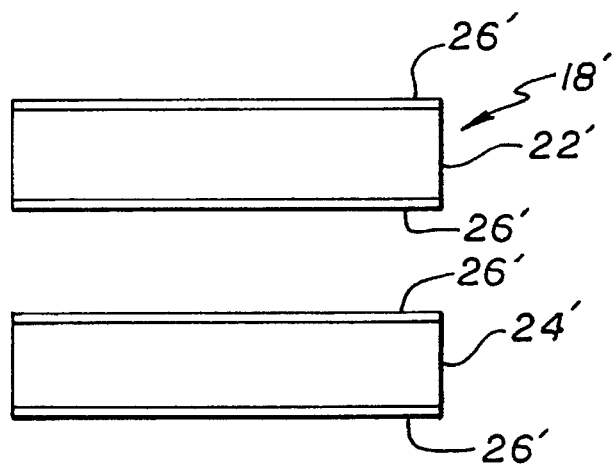
FIG. 2($a$) is a cross-sectional representation of a conventional LWIR MLD optical filter.

FIG. 2(a) is a cross-sectional representation of a conventional LWIR MLD interference stack optical filter 18'. The filter 18' includes plural semiconductor or dielectric substrates 22' and 24'. As mentioned above, the conventional MLD filter 18' is constructed by coating the substrate 24' with alternating layers 26' of high refractive index and low refractive index optical thin film materials. By depositing high and low refractive index materials in an alternating sequence, the interference filter 18' may be constructed which will reflect certain wavelengths while transmitting others. Thus, by altering the thickness of each layer of the filter, a controlled amount of a narrow band of frequencies will be allowed to enter the detector.

Figure 2B:
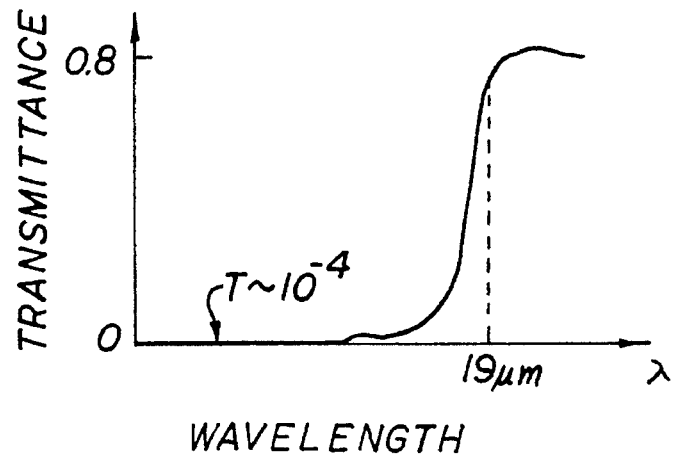

The typical design goals of conventional long wavelength infrared (LWIR) filters are to achieve: 1) broadband rejection, i.e., the filter should have a low out-of-band transmission; 2) high in-band transmission, allowing the selected transmission bands to enter the detector with minimum attenuation; and 3) a sharp cut-off slope, that is, the transition between transmitting and nontransmitting wavelength regions should be clearly defined. FIG. 2(b) is a graph representing the transmission characteristic of the conventional LWIR MLD filter 18'.

The need for broadband rejection requires an MLD filter of conventional construction with many layers. It is not uncommon for as many as 300 layers to be used in the construction of such a filter. That is, in reference to FIG. 2(a), each layer 26' is one-quarter of the operating wavelength $\delta$ divided by the index of refraction n. With an operating wavelength $\delta$ of 20 microns and an index of refraction n of say 2, each layer must be at least 2.5 microns thick. Three hundred such layers would be 750 microns thick. At this thickness, the interference layers may be thicker than the dielectric or semiconductor substrate. Thus, the filter must often be split between two or three substrates. This makes the composite filter thicker and creates a severe packaging problem. Also the many layers of coating limits the speed (f-number) of the optical system due to the fact that the spectral width of the transmitting region of these thick interference filters will shift from the design value for incoming radiation at large angles of incidence (i.e. f-number). Further, LWIR MLD optical filters are designed to function in cryogenic environments and therefore must be durable as well as functional. In accordance with conventional techniques, it is difficult to fabricate the filter for such environments due to stress and adhesion problems associated therewith. That is, the multiple layers 26' of the filter 18' must be deposited at high temperature. This places each layer under considerable stress. The adhesion of the large number of layers under such high stress is problematic. Hence, at present, only a few optical filter manufacturers have the capability of making LWIR MLD interference optical filters. Accordingly, conventional LWIR MLD filters tend to be quite expensive. Thus, there is a need in the art for a compact, durable, and cost effective filter which affords greater control of in-band and out-of-band transmission and is insensitive to the optical system f-number.

Figure 3B:
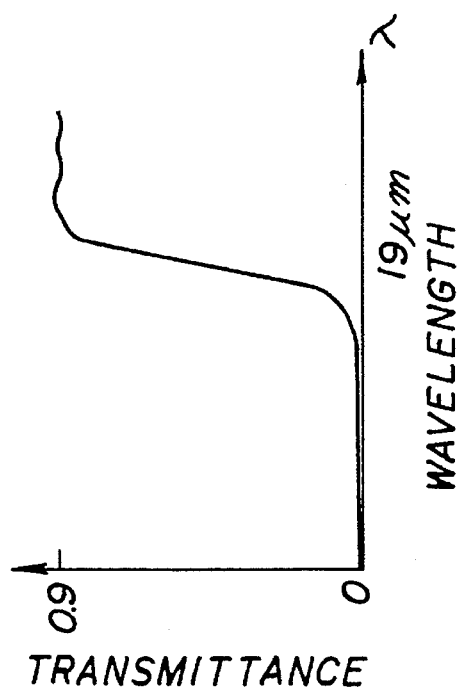
FIG. 3(b) is a graph representing the transmission characteristic of an illustrative LWIR MLD optical interference filter constructed in accordance with the teachings of the present invention.
Figure 3A:
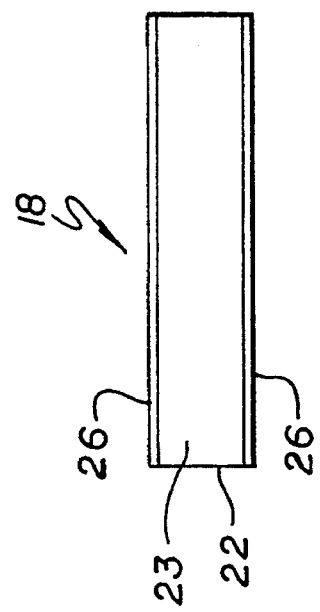
FIG. 3(a) is a cross-sectional representation of an illustrative LWIR MLD filter constructed in accordance with the teachings of the present invention.

The need in the art is addressed by the optical filter 18 of the present invention which is illustrated in FIG. 3(a). In a most general sense, the filter 18 of the present invention includes a first layer of semiconductor material 22 which is doped with an impurity ion 23 (acceptor or donor) having an energy level in the bandgap of the semiconductor material such that the first layer 22 absorbs optical energy below a first (threshold) wavelength $\delta_{th}$ and transmits optical energy thereabove. In the preferred embodiment, the first layer of material is a semiconductor substrate such as silicon (Si), germanium (Ge), cadmium telluride (CdTe), indium antimonide (InSb) that is transparent in the long wavelength infrared region. A semiconductor with low lattice absorption should be used. When cooled, this doped or extrinsic semiconductor will absorb below a threshold wavelength $\delta_{th}$ determined by the energy level of the impurity ion 23. The extrinsic semiconductor will also transmit at wavelengths greater than the threshold wavelength $\delta_{th}$.

In the illustrative embodiment of FIG. 3(a), a second layer of optical thin film material 26 is disposed on the first layer 22. The second layer is a conventional MLD interference filter which transmits optical energy at a second wavelength, above the first wavelength $\delta_{th}$, and reflects optical energy at a third wavelength above the second wavelength. The first and second layers 22 and 26 in combination provide a filter 18 with high transmission in-band, low transmission out-of-band and a sharp cutoff therebetween. FIG. 3(b) is a graph representing the transmission characteristic of an illustrative LWIR MLD optical interference filter 18 constructed in accordance with the teachings of the present invention.

The present invention allows for the achievement of out-of-band rejection two to three orders of magnitude greater than current state of the art LWIR optical filters with substantially fewer layers. Thus, the teachings provided by the present invention allow for a filter with substantially fewer coating layers for a given level of performance as most of the out-of-band rejection is achieved by absorption in the extrinsic semiconductor substrate.

Figure 4B:
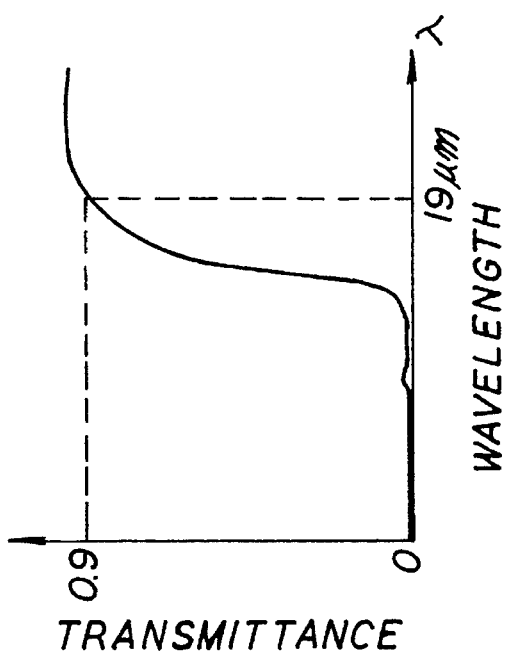
FIG. 4(b) is a graph of the illustrative LWIR MLD optical interference filter constructed of silicon doped with gallium and cooled to temperatures below 18° K. then coated with an antireflection coating for radiation in the 20 to 28 micron range in accordance with the teachings of the present invention.
Figure 4A:
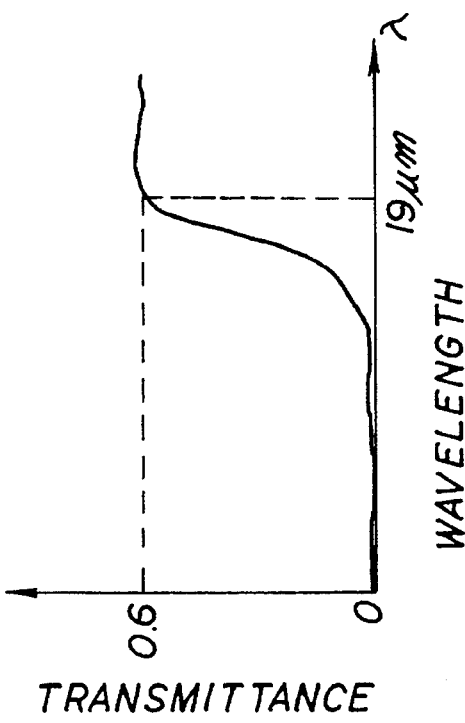
FIG. 4(a) is a graph representing the transmission characteristic of an illustrative LWIR MLD optical interference filter constructed of silicon doped with gallium and cooled to temperatures below 18° K. in accordance with the teachings of the present invention.

For example, silicon doped with gallium (SiGa), when cooled to temperatures below 18° K., absorbs at wavelengths less than 19 microns. FIG. 4(a) is a graph representing the transmission characteristic of an illustrative LWIR MLD optical interference filter 18 constructed of silicon doped with gallium and cooled to temperatures below 18° K. in accordance with the teachings of the present invention. If the filter is then coated with an antireflection (AR) coating for radiation in the 20 to 28 micron range, an effective long wavelength pass (LWP) filter is provided with high out-of-band rejection as illustrated in FIG. 4(b).

Transmission below $\delta_{th} \approx 19$ μm is given by:

$$T = e^{-\alpha x} \quad [1]$$

For $n \approx 10^{17}$ cm$^{-3}$, $\alpha$ will be $\approx 52$ cm$^{-1}$ and $T = e^{-10.4} = 3 \times 10^{-5}$ for $x = 2$ mm. Thus, by using a SiGa ($n \approx 10^{17}$ cm$^{-3}$) substrate 2 mm thick that is AR coated for the 20 to 28 μm band, an LWP filter can be constructed that offers improved performance and substantially lower cost relative to a filter constructed in accordance with conventional teachings. That is, to achieve the same performance with a conventional filter would require two substrates as illustrated in FIG. 2(a) with all four surfaces coated with a high number of layers of optical thin film material.

The teachings of the present invention could be extended to other semiconductors and dopants. For example, FIG. 5(a) illustrates the transmission characteristics as a function of wavelength, $\delta$ in microns, of a filter, constructed in accordance with the present teachings, having a silicon substrate and various dopants shown. FIG. 5(b) illustrates the transmission characteristics as a function of wavelength, $\delta$ in microns, of a filter constructed in accordance with the present teachings having a germanium substrate and various dopants shown. Other possibilities for Si:Y and Ge:Y, where Y is the impurity type, are illustrated in Tables I and II, respectively, below.

TABLE I

| Substrate | Dopant (Y) | $\lambda_{co}$(μm) |
|---|---|---|
| Si | As | 28.00 |
| Si | Ga | 19.07 |
| Si | Bi | 17.97 |
| Si | Mg | 11.30 |
| Si | S | 11.30 |
| Si | Te | 8.80 |
| Si | In | 7.75 |

TABLE II

| Substrate | Dopant (Y) | $\lambda_{co}$(μm) |
|---|---|---|
| Ge | P | 31.00 |
| Ge | Cr | 24.80 |
| Ge | Sb | 20.70 |

TABLE II-continued

| Substrate | Dopant (Y) | $\lambda_{co}$(μm) |
|---|---|---|
| Ge | Hg | 16.10 |
| Ge | Te | 12.40 |
| Ge | Ag | 12.40 |
| Ge | Au | 8.80 |

Returning to FIG. 3(a), the filter 18 is constructed by first performing a conventional design of an interference filter (typically on a computer) and then a) either depositing a layer of semiconductive material having a bandgap onto a substrate or providing a substrate of semiconductive material having a bandgap; b) doping the layer or substrate of semiconductive material with a dopant having an energy level in the bandgap thereof; and c) depositing an interference filter on the layer or substrate of semiconductive material in a conventional manner.

The doping step further includes the following steps. First, the required attenuation ex is calculated based on a desired out-of-band transmission T for the filter in accordance with equation [1] above. Next, a type of dopant is selected based on the cutoff parameter of the transmission band desired for the filter. (The threshold wavelength, is determined by the energy level of the particular impurity ion used. The absorption of radiant energy is promoted by the migration of valence electrons from lower to higher energy levels. To insure a predictable absorption as well as a selectable band pass transmittance, while avoiding free carrier absorption, it is necessary to bring the doped substrate to its lowest energy level by placing it in a cryogenic environment.) The upper transmittance wavelength is determined by the band gap of the semiconductor substrate used. The lower transmittance wavelength is determined by the dopant's absorption properties. Given the desired thickness x of the layer or substrate of semiconductive material, the absorption coefficient $\alpha$ required for the filter is calculated by taking the log of both sides of equation [1]. The concentration of the chosen dopant is then determined from measured data in the literature based on the calculated absorption coefficient $\alpha$. The layer of substrate of desired thickness x of semiconductive material is then doped with the dopant in accordance with the ascertained concentration.

As previously stated, the doped substrate must be cooled below a critical temperature. The extrinsic semiconductor will then transmit at wavelengths greater than the threshold wavelength $\delta_{th}$ and absorb wavelengths below the threshold wavelength $\delta_{th}$, thus forming a selectable cut off for a long wavelength band pass filter.

Finally, the transmission characteristic of the interference filter is specified based on the transmission characteristic of the doped layer or substrate of semiconductive material.

As is evident in the Tables above, the lower transmittance cut-off is determined by the absorption wavelength of the dopant. By changing the dopant, the lower cut-off of the passband can be adjusted. This is highly advantageous because the filter can be fabricated to accept greater fields of view without suffering a degradation in in-band transmittance.

As most of the out-of-band rejection is achieved by absorption in the extrinsic semiconductor substrate, the present invention allows for the achievement of out-of-band rejection two to three orders of magnitude greater than current state of the art long wave infrared (LWIR) optical filters with substantially fewer coating layers for a given level of performance.

FIG. 6 is an alternative embodiment of the present invention in which the multiple layers of optical thin film material are replaced by doping of the detector in accordance with the present teachings. As illustrated in FIG. 6, the substrate of the detector 20" may be doped with an impurity 25" such that the filter 18" provides a first layer of material having a bandgap and being doped with an impurity 23" having an energy level in the bandgap such that the filter 18" absorbs optical energy below a first wavelength and transmits optical energy thereabove. And the detector 20" provides a second layer of material, in optical alignment with the first layer, having a bandgap and being doped with an impurity 25" having an energy level in the bandgap thereof such that the detector absorbs optical energy above the first wavelength up to the threshold wavelength. The result of this filter/detector combination is an arrangement with a precisely defined passband without the need for MLD coating.

Thus, the present invention has been described herein with reference to a particular embodiment for a particular application. Those having ordinary skill in the art and access to the present teachings will recognize additional modifications applications and embodiments within the scope thereof. For example, the invention is not limited to the combination of dopant and substrate used. Nor is the invention limited to manner in which the dopant is effected. And the invention is not limited to use in an optical filter.

It is therefore intended by the appended claims to cover any and all such applications, modifications and embodiments within the scope of the present invention.

I claim:

1. An optical filter comprising:

a layer of semiconductor material adapted to absorb optical energy below a first wavelength and transmit optical energy above said first wavelength, said first wavelength being in the infrared bandwidth, and a plurality of layers of optical thin film material, disposed on said semiconductor layer, for transmitting optical energy at a second wavelength, which is above said first wavelength, and for reflecting optical energy at a third wavelength, which is above said second wavelength, whereby said semiconductor and optical layers in combination provide high transmission in-band, low transmission out-of-band and a sharp cutoff.

2. The filter of claim 1 wherein said semiconductor layer has a low lattice absorption and wherein said layer is doped with a dopant that determines said first wavelength.

3. The filter of claim 2 wherein said semiconductor layer is made of germanium and wherein said dopant is selected from a group consisting of P, Cr, Sb, Hg, Te, Ag and Au.

4. The filter of claim 2 wherein said semiconductor layer is made of silicon and wherein said dopant is selected from a group consisting of As, Ga, Bi, Mg, S, Te, and In.

5. The filter of claim 4 wherein said dopant is Gallium, whereby said first wavelength is approximately 19 microns, and wherein said second and third wavelengths are approximately 20 and 28 microns, respectively.

6. The filter of claim 1 wherein said plurality of layers includes alternating layers of high refractive index and low refractive index optical materials.

7. The filter of claim 6 wherein said alternating layers provide an MLD interference filter.

8. The filter of claim 1 wherein said filter is a long wavelength infrared filter.

9. A method of fabricating a long wavelength infrared filter, said method comprising the steps of:

a) depositing a layer of semiconductive material;

b) doping said layer of semiconductive material with a dopant that allows said a layer to absorb electromagnetic radiation below a cutoff wavelength and transmit long wavelength infrared radiation above said cutoff wavelength; and c) depositing on said layer of semiconductive material an interference filter that reflects long wavelength infrared radiation having wavelengths longer than a first wavelength, which is longer than said cutoff wavelength.

10. The method of claim 9 wherein said semiconductive material is Germanium, and wherein said dopant is selected from a group consisting of P, Cr, Sb, Hg, Te, Ag and Au.

11. The method of claim 9 wherein said semiconductive material is Silicon, and wherein said dopant is selected from a group consisting of As, Ga, Bi, Mg, S, Te, and In.

12. The method of claim 11 wherein said lower and upper wavelengths of said interference filter are approximately 20 and 28 microns, respectively, and wherein Gallium is selected as said dopant.

13. A system comprising an infrared detector and a long wavelength infrared filter for said detector, said filter including:

an optical filter adapted to receive electromagnetic radiation and reflect long wavelength infrared radiation longer than a first wavelength; and a doped semiconductor substrate, in optical alignment with said optical filter, for absorbing electromagnetic radiation having wavelengths shorter than a cutoff wavelength and transmitting long wavelength infrared radiation having wavelengths longer than said cutoff wavelength, said cutoff wavelength being shorter than said first wavelength.

14. The system of claim 13 further including a cryogenic cooler for cryogenically cooling said semiconductor substrate.

15. The system of claim 13 wherein said semiconductor substrate is made of silicon and doped with a dopant selected from a group consisting of As, Ga, Bi, Mg, S, Te, and In.

16. The system of claim 13 wherein said semiconductor substrate is made of germanium and doped with a dopant selected from a group consisting of P, Cr, Sb, Hg, Te, Ag and Au.

17. The system of claim 13 wherein said bandpass filter includes alternating layers of high refractive index and low refractive index optical materials.

18. The system of claim 13, wherein said bandpass filter is an MLD interference filter.

* * * * *